United States Patent
Raoul et al.

(10) Patent No.: US 12,426,190 B2
(45) Date of Patent: Sep. 23, 2025

(54) KIT FOR MANUFACTURING ELECTRONIC AIRCRAFT CONTROL UNITS

(71) Applicant: SAFRAN ELECTRONICS & DEFENSE, Paris (FR)

(72) Inventors: Etienne Raoul, Moissy-Cramayel (FR); Jean-Baptiste Lebrun, Moissy-Cramayel (FR); Jean-Charles Riand, Moissy-Cramayel (FR); Kamal Aouchiche, Moissy-Cramayel (FR)

(73) Assignee: SAFRAN ELECTRONICS & DEFENSE, Boulogne-Billancourt (FR)

( * ) Notice: Subject to any disclaimer, the term of this patent is extended or adjusted under 35 U.S.C. 154(b) by 795 days.

(21) Appl. No.: 17/618,326

(22) PCT Filed: Jun. 12, 2020

(86) PCT No.: PCT/EP2020/066411
§ 371 (c)(1),
(2) Date: Dec. 10, 2021

(87) PCT Pub. No.: WO2020/249806
PCT Pub. Date: Dec. 17, 2020

(65) Prior Publication Data
US 2022/0411104 A1    Dec. 29, 2022

(30) Foreign Application Priority Data

Jun. 14, 2019 (FR) ........................ 1906371

(51) Int. Cl.
*H04L 12/40* (2006.01)
*H05K 7/00* (2006.01)
*H04L 12/46* (2006.01)

(52) U.S. Cl.
CPC ....... *H05K 7/005* (2013.01); *H04L 12/40006* (2013.01); *H04L 2012/4028* (2013.01); *H04L 12/4625* (2013.01)

(58) Field of Classification Search
CPC ............ H05K 7/005; H04L 12/40006; H04L 12/4625; H04L 2012/4028; H04B 15/00
See application file for complete search history.

(56) References Cited

U.S. PATENT DOCUMENTS 8,977,798 B2 * 3/2015 Mitani ............. H04L 12/40006
    710/316
2005/0173595 A1   8/2005 Hoh
(Continued)

FOREIGN PATENT DOCUMENTS

FR      3013880 A1    5/2005
JP      2007-251489   *  9/2007

OTHER PUBLICATIONS

Cevher et al., "A Fault Tolerant Software Defined Networking Architecture for Integrated Modular Avionics," 2018 IEEE/AIAA 37th Digital Avionics Systems Conference (DASC), London, UK, 2018, pp. 1-9. (Year: 2018).*

*Primary Examiner* — A. Dexter Tugbang
(74) *Attorney, Agent, or Firm* — MUNCY, GEISSLER, OLDS & LOWE, P.C.

(57) ABSTRACT

A kit for manufacturing electronic aircraft control units having different specifications, the units including electronic modules of different types, including avionics platform modules comprising at least an electronic monitoring circuit and an electronic control circuit that are segregated from each other; first protection modules for protecting the avionics platform modules; first extended connection modules;

(Continued)

and second protection modules for protecting the extended connection modules; the modules of each type being identical with one another.

15 Claims, 13 Drawing Sheets

(56) References Cited

U.S. PATENT DOCUMENTS

| | | | |
|---|---|---|---|
| 2005/0228549 A1* | 10/2005 | Stickling | H04B 15/00 701/3 |
| 2010/0226388 A1* | 9/2010 | Shen | H04L 12/4625 370/463 |
| 2012/0278656 A1 | 11/2012 | Berkhahn et al. | |
| 2015/0088341 A1 | 3/2015 | De Rammelaere et al. | |
| 2015/0341677 A1* | 11/2015 | Petrisor | H04L 2012/4028 725/76 |
| 2019/0036732 A1* | 1/2019 | Dormiani | H04L 2012/4028 |
| 2019/0109727 A1 | 4/2019 | Toillon et al. | |

* cited by examiner

KIT FOR MANUFACTURING ELECTRONIC AIRCRAFT CONTROL UNITS

The present invention relates to the field of aviation, and more particularly to basic architectures for electronic equipment on board aircraft, including helicopters.

BACKGROUND OF THE INVENTION

Such electronic circuits are used for making up electronic control units that are connected to flight controls, to engines, and to sensors, and they perform the calculations necessary for operating and piloting aircraft.

Each aircraft is fitted with an electronic control unit adapted to the conditions in which the aircraft is to be operated and to the performance expected of the aircraft (civil or military flight, private or commercial use, carrying passengers or cargo, . . . ). The flight conditions and the performance of an aircraft are defined by the specifications of that aircraft, and the control unit is designed and manufactured specifically to meet those specifications.

The manufacturer of electronic control units therefore needs to propose flight control units that are generally specific to different types of aircraft. That leads to costs in terms of design, manufacture, certification, and storage.

OBJECT OF THE INVENTION

A particular object of the invention is to propose means that make it possible to simplify the construction of electronic flight control units for aircraft.

SUMMARY OF THE INVENTION

To this end, according invention, there is provided a kit for constructing aircraft flight control units having different specifications, the kit comprising electronic modules of different types, the modules of each type being identical with one another, and including:
  avionics platform modules comprising at least an electronic monitoring circuit and an electronic control circuit that are segregated from each other;
  first protection modules for protecting the avionics platform modules;
  first extended connection modules; and
  second protection modules for protecting the extended connection modules.

Thus, by selecting from the kit an avionics platform module or a plurality of modules for connecting together, it is possible to make electronic units that are adapted to aircraft of a plurality of types. Since the avionics platform modules are common to all of the control units, it is possible to achieve economies of scale. Also, it is possible to match the control unit very closely to the required specifications by selecting and assembling together the necessary modules for meeting the specifications of aircraft.

The invention also provides a method of constructing an aircraft flight control unit meeting predetermined technical specifications, the method comprising the steps of:
  selecting the electronic module(s) that are needed to make the control unit as a function of predetermined technical specifications, the control unit comprising at least one avionics platform module; and
  connecting together the selected module(s) in order to make the control unit.

For example, it is possible to make electronic control units for the following four different types of aircraft:

for a light aircraft that is to fly only under visual flight rules (VFR) conditions, an electronic control unit comprising only an avionics platform module;
  for a light or medium aircraft that is to fly in all-weather conditions, an electronic control unit comprising two avionics platform modules connected to a first protection module;
  for a medium transport aircraft that is to fly in all-weather conditions, an electronic control unit comprising two avionics platform modules connected to a first lightning protection module, and two extended connection modules, each connected to the first protection module and to a second protection module; and
  for a heavy transport aircraft that is to fly in all-weather conditions, an electronic control unit comprising two pairs of avionics platform modules connected to a first protection module, and two pairs of extended connection modules, each connected to one of the first protection modules and to a second protection module, each avionics platform module of one of the pairs being connected to one of the avionics platform modules of the other pair, and each extended connection module of one of the pairs being connected to one of the extended connection modules of the other pair.

Other characteristics and advantages of the invention appear on reading the following description of a particular and nonlimiting implementation of the invention.

BRIEF DESCRIPTION OF THE DRAWINGS

Reference is made to the accompanying drawings, in which.

DETAILED DESCRIPTION OF THE INVENTION

Figure 1:
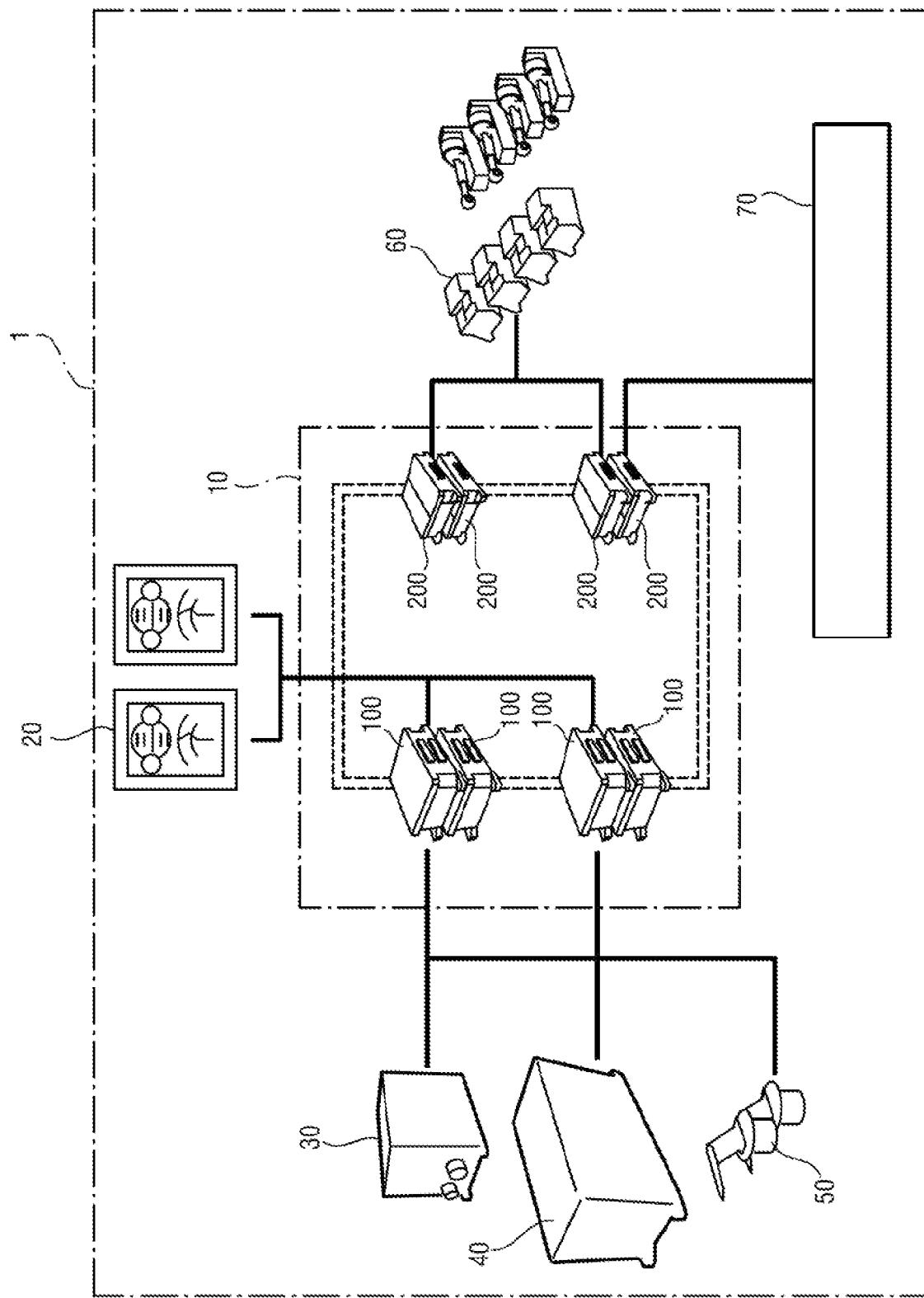
FIG. 1 is a diagrammatic representation of an aircraft fitted with a control unit.
Figure 2:
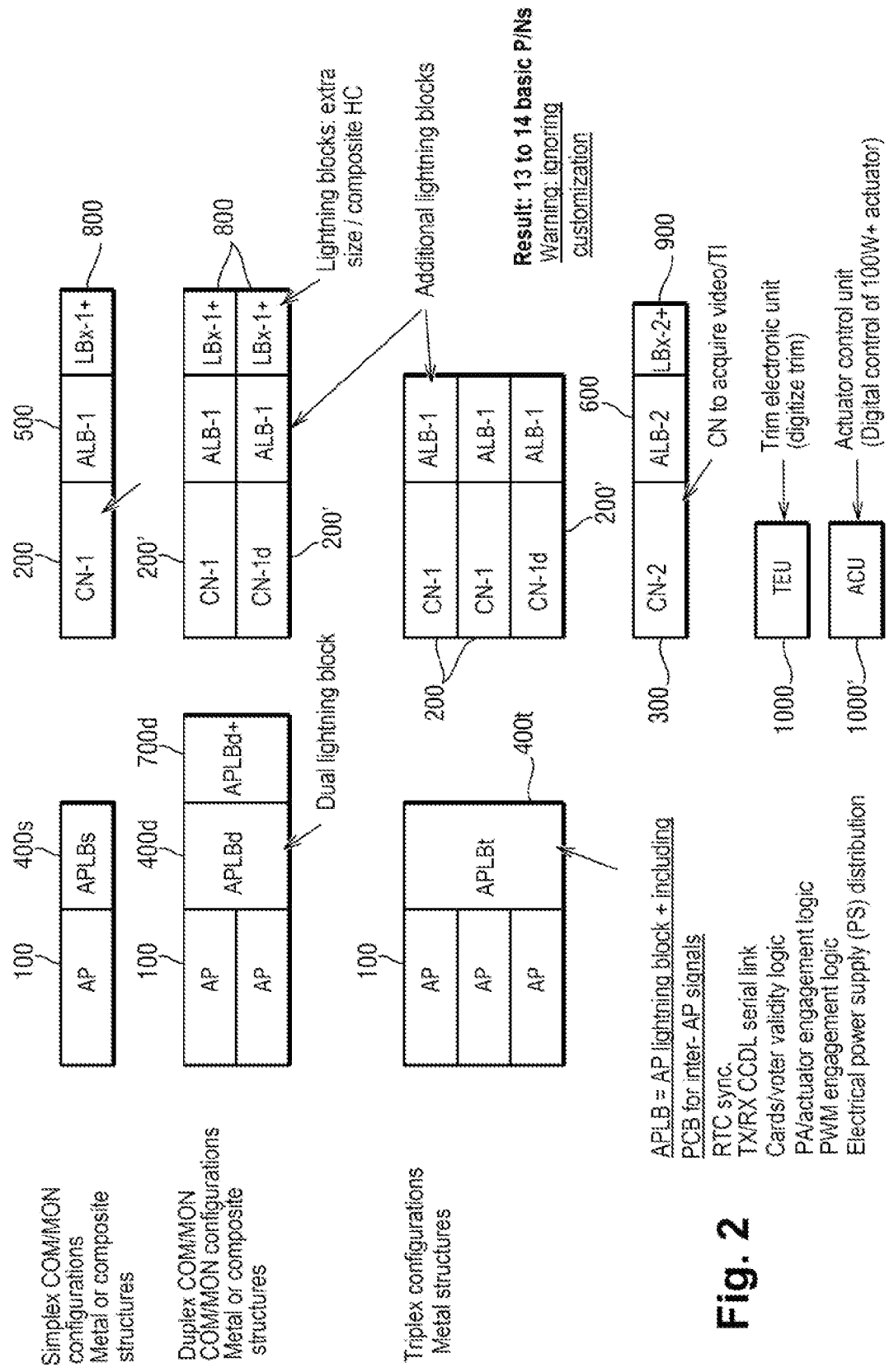
FIG. 2 is a diagrammatic representation of various different electronic modules of a kit of the invention.

With reference to FIG. 1, an aircraft, such as a helicopter 1, includes an electronic control unit 10 that is connected: to a pilot interface 20, to an inertial navigation system 30, to an attitude and heading reference system (AHRS) 40, to sensors 50, to a trim device 60, and two pieces of equipment 70, such as the engine(s), the landing gear, . . . . The electronic control unit 10 exchanges information with all of those elements in order to enable the helicopter to operate and to be piloted when the automatic flight control system (AFCS) is activated.

In this example, the electronic control unit 10 comprises two pairs of avionics platform modules 100 connected to two pairs of extended connection modules 200 by an Ethernet type network. The avionics platform modules 100 are connected to the pilot interface 20, to the inertial navigation system 30, to the attitude and heading reference system 40, and to the sensors 50. The extended connection modules 200 are connected to the trim device 60 and to the pieces of equipment 70.

Each avionics platform module 100 is arranged:
- to receive data signals from the inertial navigation system 30, from the attitude and heading reference system 40, from the sensors 50, from the trim device 60, and from the pieces of equipment 70;
- to receive the control signals from the pilot interface 20;
- to respond to the received signals by preparing control signals that are to be transmitted to the trim device 60 and to the pieces of equipment 70;
- to monitor the elements to which it is connected; and
- to transmit data signals (in particular states) to the pilot interface 20.

Each extended connection module 200 includes a single processor circuit that is connected to a connector for connection to avionics platform module and to respective connectors for connection to the elements that are to be connected to the avionics platform module via the extended connection module. The processor circuit serves to convert analog signals into digital signals, and vice versa.

In order to manufacture the electronic control unit 10, these modules are selected from a kit of electronic modules comprising modules of various different types, with the modules of each type being identical to one another. These modules comprise:
- avionics platform modules 100;
- first extended connection modules 200;
- second extended connection modules 200';
- video acquisition modules 300;
- single first basic protection modules 400s;
- double first basic protection modules 400d;
- triple first basic protection modules 400t;
- second basic protection modules 500;
- third basic protection modules 600 for protecting the video acquisition modules;
- first additional protection modules 700 (specifically 700d since they are double);
- second additional protection modules 800;
- third additional protection modules 900;
- trim modules 1000; and
- actuator control modules 1100 to perform analog/digital conversion of signals exchanged between the avionics platform modules and an analog actuator.

The structures of the various different types of module are described below.

The first extended connection modules 200 are described above. The second extended connection modules 200' perform the same functions as the first extended connection modules 200, but they are of structure that is different from the structure of said first extended connection modules so that they are not sensitive to the same failures and disturbances.

Each video acquisition module 300 comprises a conventional image processor circuit.

Each basic protection module 400s, 400d, 400t, 500, and 600 comprises an electronic protection circuit arranged to protect the module to which the protection module is connected against voltage surges and electromagnetic fields (and electromagnetic compatibility (an electromagnetic compatibility (EMC) function incorporating a lightning arrester function). The electronic protection circuit, which is itself known, comprises dissipative elements such as transorbs that are rated as a function of the characteristics of the module to which the protection module is connected. Such rating presents no difficulty for the person skilled in the art.

Each single first basic protection module 400s presents a single connector for connection to an avionics platform module; each double first basic protection module 400d presents two connectors for connection to an avionics platform module; and each triple first basic protection module 400t presents three connectors for connection to an avionics platform module.

Each additional protection module 700, 800, 900 comprises an electronic protection circuit arranged to be connected to a basic protection module in order to adapt the protection to aircraft of composite structure. It is known that conducting lightning strikes away is more difficult in aircraft made of composite material than in aircraft made of metal. The person skilled in the art knows how to design and rate protection circuits.

Each trim module 1000 comprises an electronic circuit arranged to perform analog/digital conversion of the signals exchanged between the avionics platform modules 100 and an analog trim device. Such a circuit is known to the person skilled in the art.

Each actuator control module 1100 comprises an electronic circuit for performing analog/digital conversion of signals exchanged between the avionics platform modules 100 and at least one analog actuator. Such a circuit is known to the person skilled in the art.

The functions of the avionics platform module 100 are mentioned above, and its internal structure is described in detail below.

Figure 8:
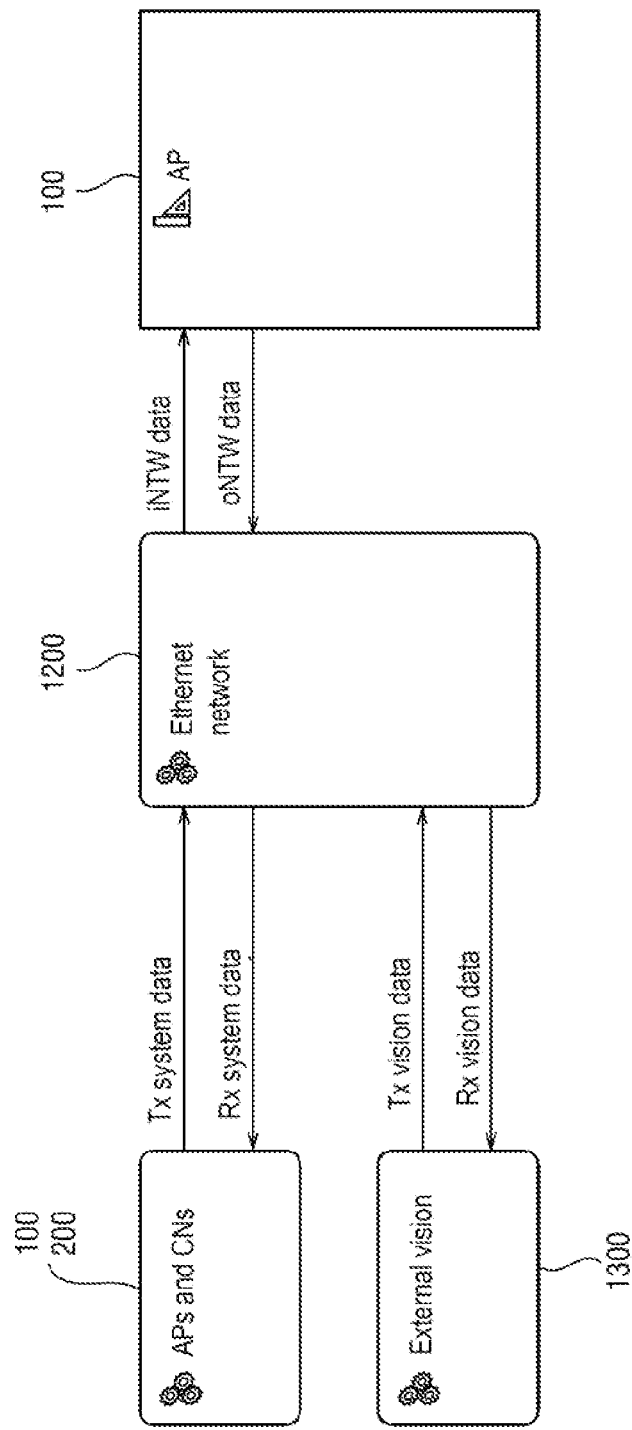
FIG. 8 is a diagrammatic representation showing data exchanges in the control unit.

As shown in FIG. 8, the avionics platform modules 100 and the extended connection modules are connected to one another by an Ethernet network 1200 that also has an external vision device connected thereto. The electronic modules 100 and 200 incorporate Ethernet interfaces that are preferably of the Advanced Ethernet Network type to enable them to communicate with one another. Each module 100, 200 incorporates an Ethernet switch that has a database dedicated to the configuration of the network and that is provided with the ability to filter and smooth traffic so as to guarantee its integrity. By way of example, use is made of an Ethernet frame having 1518 bytes on a 1 gigabit per second (Gb/s) Ethernet network of the "store and forward" type. In this example, the modules 100 and 200 are connected to one another by a network having topology of the Quad Ring bus type without reconfiguration in the event of failures.

Figure 11:
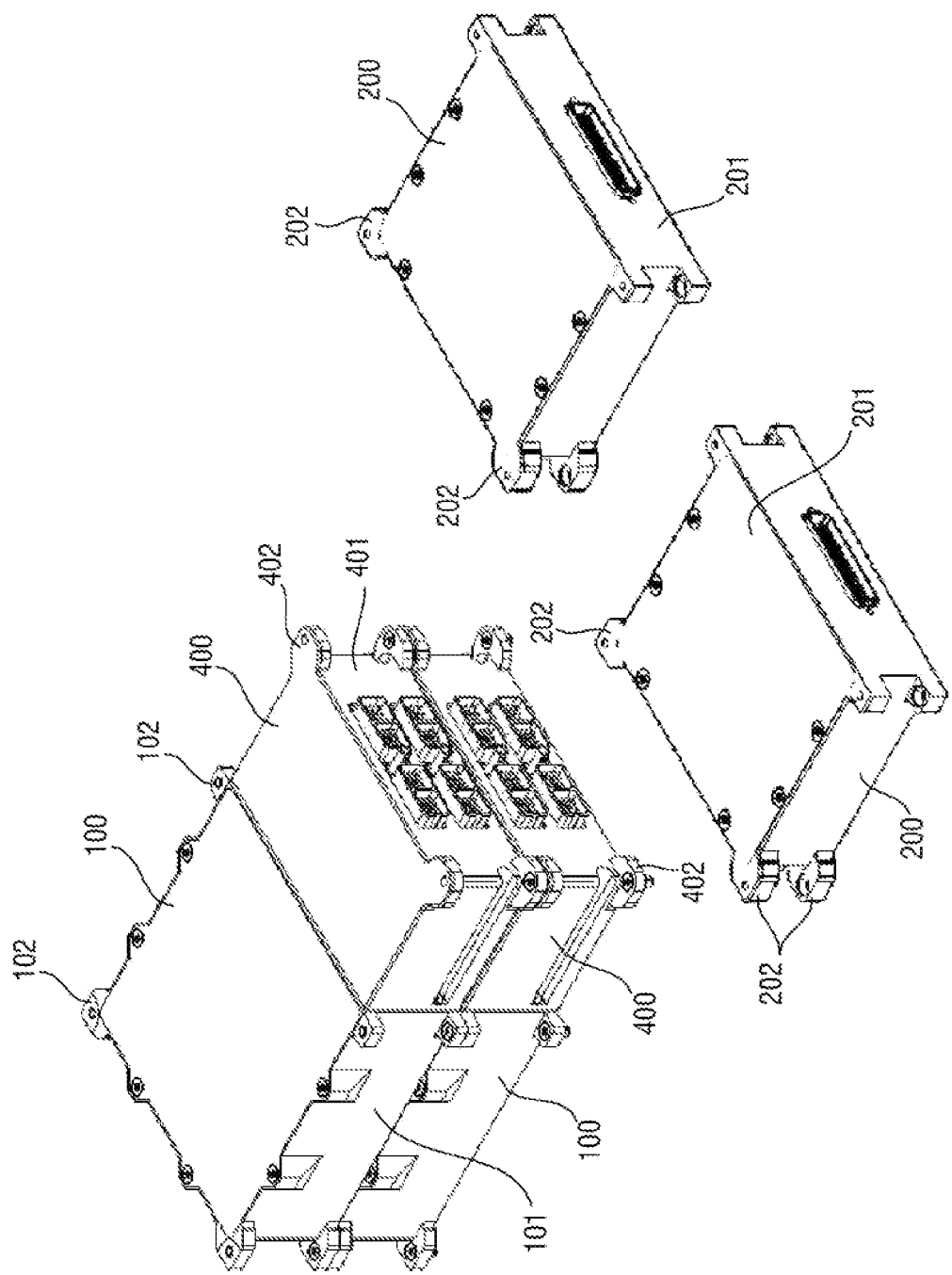
FIG. 11 is a perspective view of modules of the invention while they are being assembled together.

With reference to FIG. 11, the electronic modules, including the modules 100, 200, and 400, are contained in housings 101, 201, and 401 in the shape of rectangular boxes with side faces from which there extend fastener lugs 102, 202, and 402 enabling the housings to be fastened to one another by means of bolts passing through facing lugs.

One of the side faces of the housings 101 has two external connectors passing therethrough. Two of the side faces of the housings 401 have two external connectors passing therethrough. Two of the side faces of the housings 201 have one external connector passing therethrough.

The manufacturing method of the invention comprises the steps of:
- selecting, from the kit of electronic modules, the electronic module(s) that are needed to make the control unit as a function of predetermined technical specifications, the control unit comprising at least one avionics platform module 100; and
- connecting and fastening together the selected modules in order to make the control unit.

Figure 3:
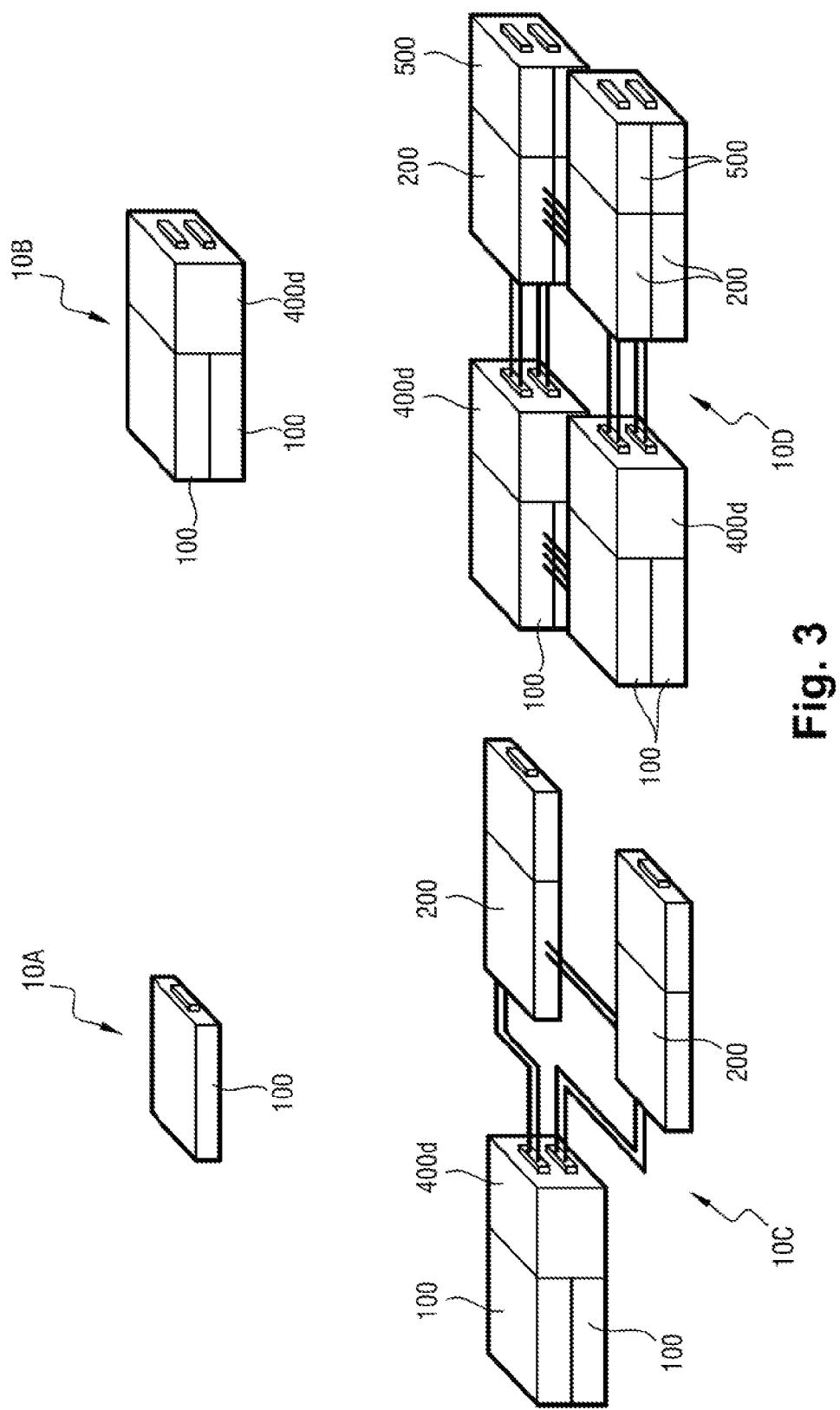
FIG. 3 is a diagrammatic representation of various different assemblies of modules for making up control units from a kit of the invention.

FIG. 3 shows four control units that are relatively basic and that can be made by the method of the invention.

This figure shows:
- an electronic control unit 10A for a light aircraft that is to fly only under visual flight rules (VFR) conditions;
- an electronic control unit 10B for a light aircraft that is to fly in all-weather conditions;
- an electronic control unit 10C for a medium transport aircraft that is to fly in all-weather conditions; and
- an electronic control unit 10D for a heavy transport aircraft that is to fly in all-weather conditions.

The control unit 10A comprises a single avionics platform module 100 that is for connection to digital elements such as an inertial navigation system, flight control actuators, and engine control actuators.

The electronic control unit 10B comprises two avionics platform modules 100 that are connected to a double first protection module 400d. The avionics platform modules 100 are for connecting to digital elements, and for example: directly to an inertial navigation system, and via the double first protection module 400d to flight control actuators and to engine control actuators.

The electronic control unit 10C comprises two avionics platform modules 100 connected to a double first protection module 400d, and two extended connection modules 200, each of which is connected to the first protection module 400d and to a respective second protection module 500. Each extended protection module 200 is connected via the second protection module 500 to analog elements such as flight control actuators and/or engine control actuators.

The electronic control unit 10D comprises two pairs of avionics platform modules 10, each pair connected to a respective double first protection module 400d, and two pairs of extended connection modules 200, each of which is connected to one of the first protection modules 400b and to a respective second protection module 500. Each avionics platform module 10 in one of the pairs is connected to one of the avionics platform modules 10 of the other pair, and each extended connection module 200 of one of the pairs is connected to one of the extended connection modules 200 of the other pair. It can be understood that this electronic control unit 10D provides module redundancy suitable for mitigating a failure.

All of the elements connected to a control unit 10A, 10B, 10C, or 10D are digital elements, such that the extended connection modules 200, the trim module 1000, and the actuator control module 1100 are not needed.

Figure 4:
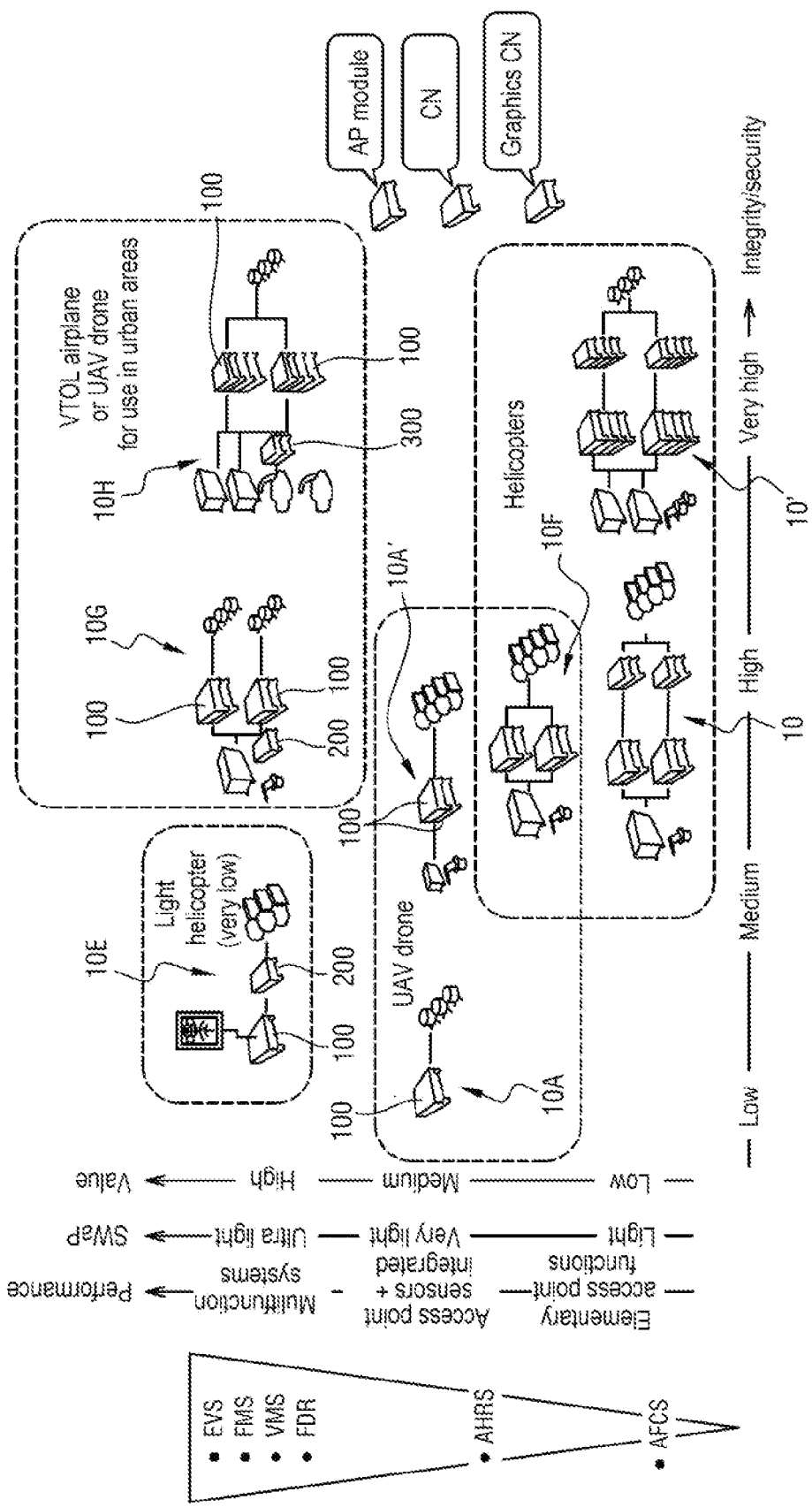
FIG. 4 is a diagrammatic representation of various different control units that can be made using the same kit of the invention.

In FIG. 4, there can be seen various different control units that can be made by means of a kit of the invention, the units being positioned on a graphic representative of the specifications predetermined for these electronic control units, the graphic plotting:
- along an abscissa axis, increasing safety and integrity requirements; and
- up an ordinate axis, the functions performed by the electronic control unit, performance, value, and the size, weight, and performance (SWaP) ratio.

The meanings of the acronyms specifying the functions performed by the electronic control unit are summarized below:
- EVS for enhanced vision system;
- FMS for flight management system;
- VMS for vehicle monitoring system;
- FDR for flight data recording system;
- AHRS for attitude and heading reference system; and
- AFCS for automatic flight control system.

The kit of modules and the method of the invention enable the following to be made:
- control units for helicopters;
- control units for drones (or "unmanned aerial vehicles" (UAVs));
- control units for light helicopters; and
- control units for UAVs or for vertical takeoff and landing (VTOL) vehicles for use in urban areas.

As can be seen in FIG. 4, the specifications for the electronic control units of those various different vehicles are different from one another and determine which electronic modules are selected.

In the electronic control units of FIG. 4, the protection modules are not mentioned.

For light helicopters, the electronic control unit 10E comprises an avionics platform module 100 and an extended connection module 200.

For UAVs, use is made of an electronic control unit 10A as described above or of an electronic control unit 10A' that comprises two avionics platform modules 100 to provide redundancy.

For helicopters, it is possible to use the electronic control unit 10 of FIG. 1; or an electronic control unit 10' comprising two sets of four avionics platform modules 100 and two sets of four extended connection modules 200 in order to provide redundancy; or an electronic control unit 10F comprising two pairs of avionics platform modules 100 in order to provide redundancy.

For UAVs or VTOL vehicles, the electronic control unit 10G comprises two pairs of avionics platform modules 100 and an extended connection module 200; or the electronic control unit 10H comprises two sets of four of avionics platform modules 100 and a pair of video acquisition modules 300.

Figure 12:
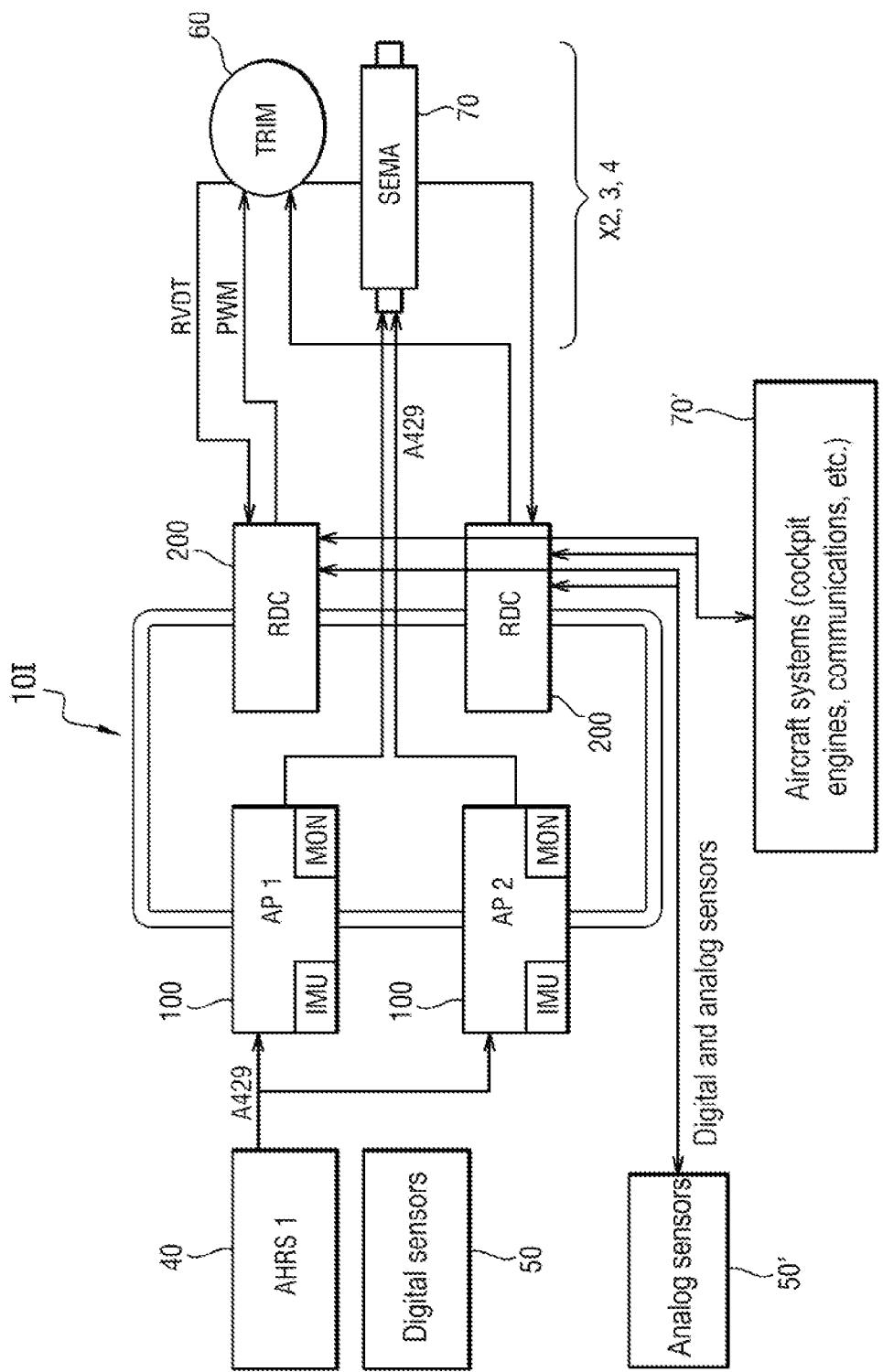
FIG. 12 is a diagrammatic representation of an aircraft control unit including analog components.

An example of an electronic control unit 10I is shown in FIG. 12: this electronic unit 10I is for fitting to a helicopter having both digital elements and analog elements. The digital elements comprise an attitude and heading reference system 40, sensors 50, and actuators 70. The analog elements comprise sensors 50', a trim actuator, trim sensors of the rotary variable differential transformer (RVDT) type, and actuators 70'.

The electronic control unit 10 comprises two avionics platform modules 100 connected by an Ethernet network to two extended connection modules 200.

The avionics platform modules 100 are connected directly to the digital elements, and the extended connection modules 200 are connected directly to the analog elements.

Figure 13:
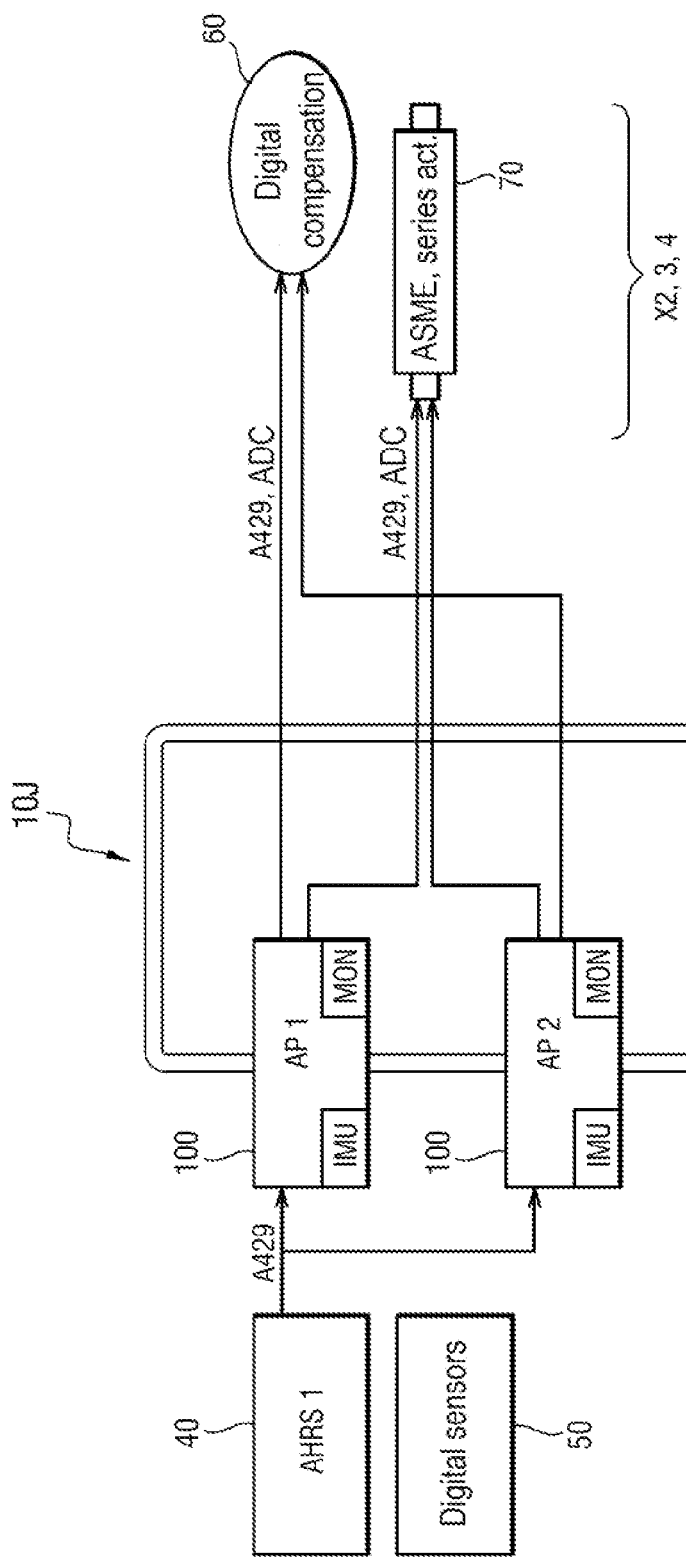
FIG. 13 is a diagrammatic representation of an aircraft control unit comprising digital components only.

Another example of an electronic control unit 10J is shown in FIG. 13: this electronic unit 10J is for fitting to a helicopter having digital elements that comprise an attitude and heading reference system 40, sensors 50, a trim actuator, trim sensors of RVDT type, and actuators 70.

The electronic control unit 10 comprises two avionics platform modules 100 connected directly to the digital elements.

The structure of an avionics platform module 10 is described below in detail.

Figure 5:
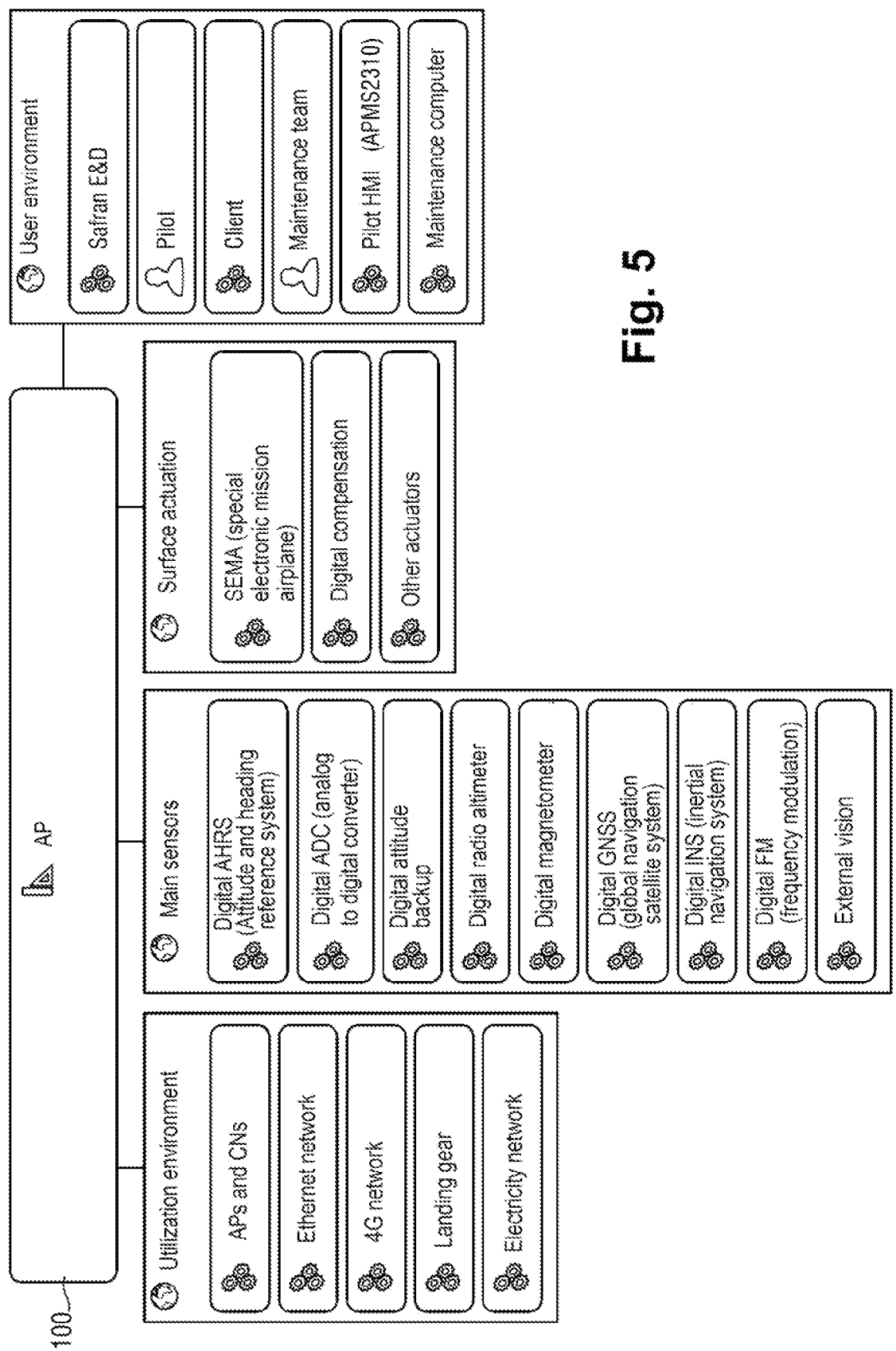
FIG. 5 is a diagrammatic representation of an avionics platform module and of the elements with which it is in communication.

In FIG. 5, there can be seen all of the elements with which an avionics platform module needs to communicate. These elements may comprise:
- the other avionics platform modules 100 and extended connection module 200;
- the Ethernet network;
- the 4G network;
- the landing gear;
- the power supply network;
- the attitude and heading reference system 40;
- an air detection system 50e (for detecting pressure, speed, temperature);
- an attitude backup memory 50a;
- a radio altimeter 50c;
- a magnetometer 50d;
- a receiver 50b for receiving signals from a global navigation satellite system (GNSS);
- the inertial navigation system 30;
- the FMS system;
- an external vision system;
- actuators 70 including flight control surface actuators;
- the trim device 60;
- the manufacturer of the modules;
- the owner of the aircraft;
- the maintenance interface and the maintenance team; and
- the pilot interface 20 and the pilot.

Figure 6:
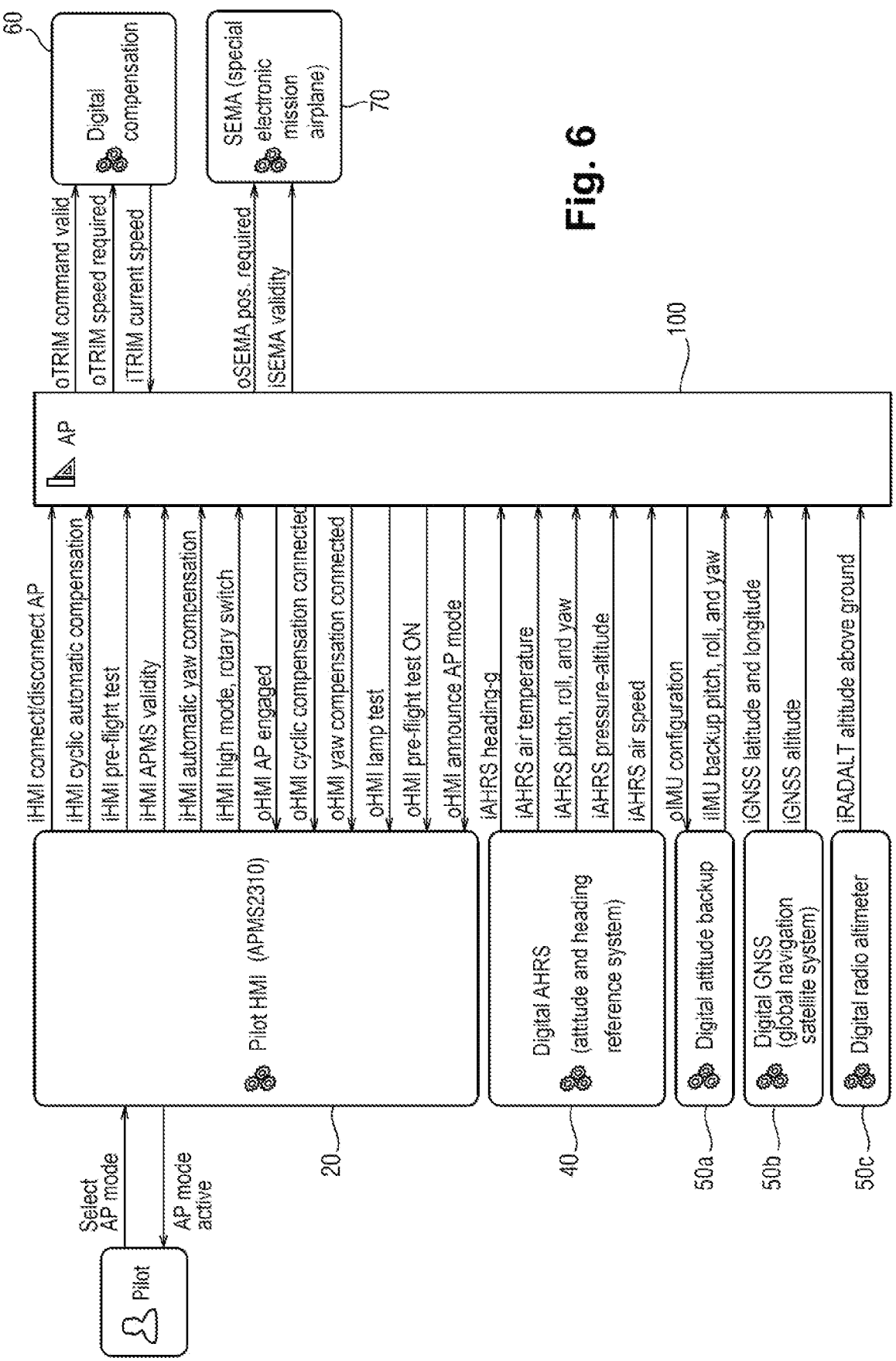
FIG. 6 is a diagrammatic representation of a control unit in its environment for highlighting the signals that are exchanged.
Figure 7:
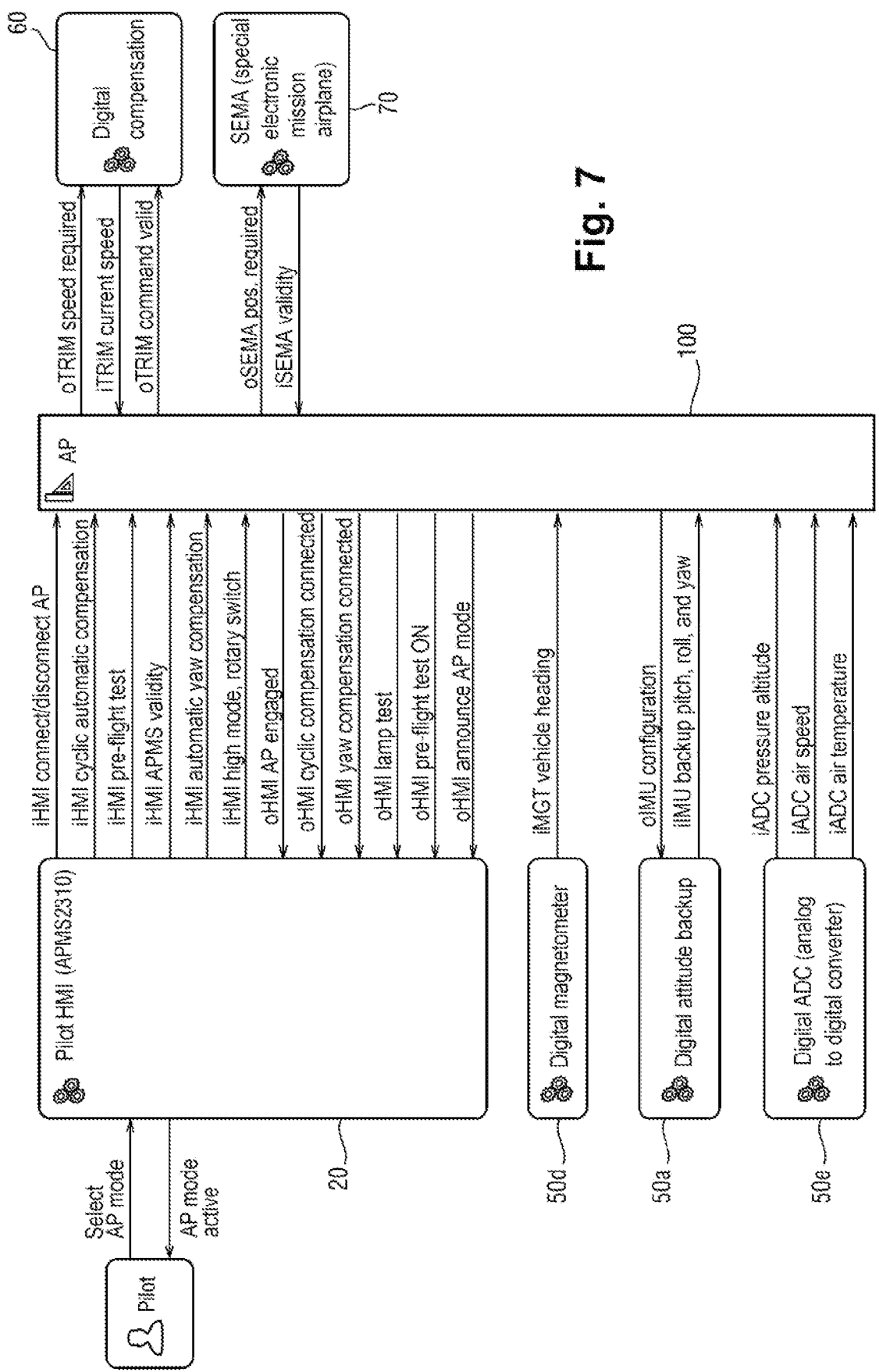
FIG. 7 is a view analogous to FIG. 6 showing a control unit in a variant embodiment.

FIGS. 6 and 7 show the signals exchanged between the various different elements and the avionics platform module 100 for two different aircraft configurations.

In both configurations, the avionics platform module 100:
- receives data from the pilot interface 20 and transmits data to the pilot interface 20;
- receives data from the attitude backup memory 50a and transmits data thereto;
- receives data from the trim device 60 and transmits data to the trim device 60; and
- receives data from the actuators 70 and transmits data to the actuator 70.

Also, in FIG. 6, the avionics platform module 100:
- receives data from the attitude and heading reference system 40;
- receives data from the satellite signal receiver 50b; and
- receives data from the radio altimeter 50c.

Also, in FIG. 7, the avionics platform module 100:
- receives data from the magnetometer 50d;
- receives data from the air detection system 50e.

Figure 9:
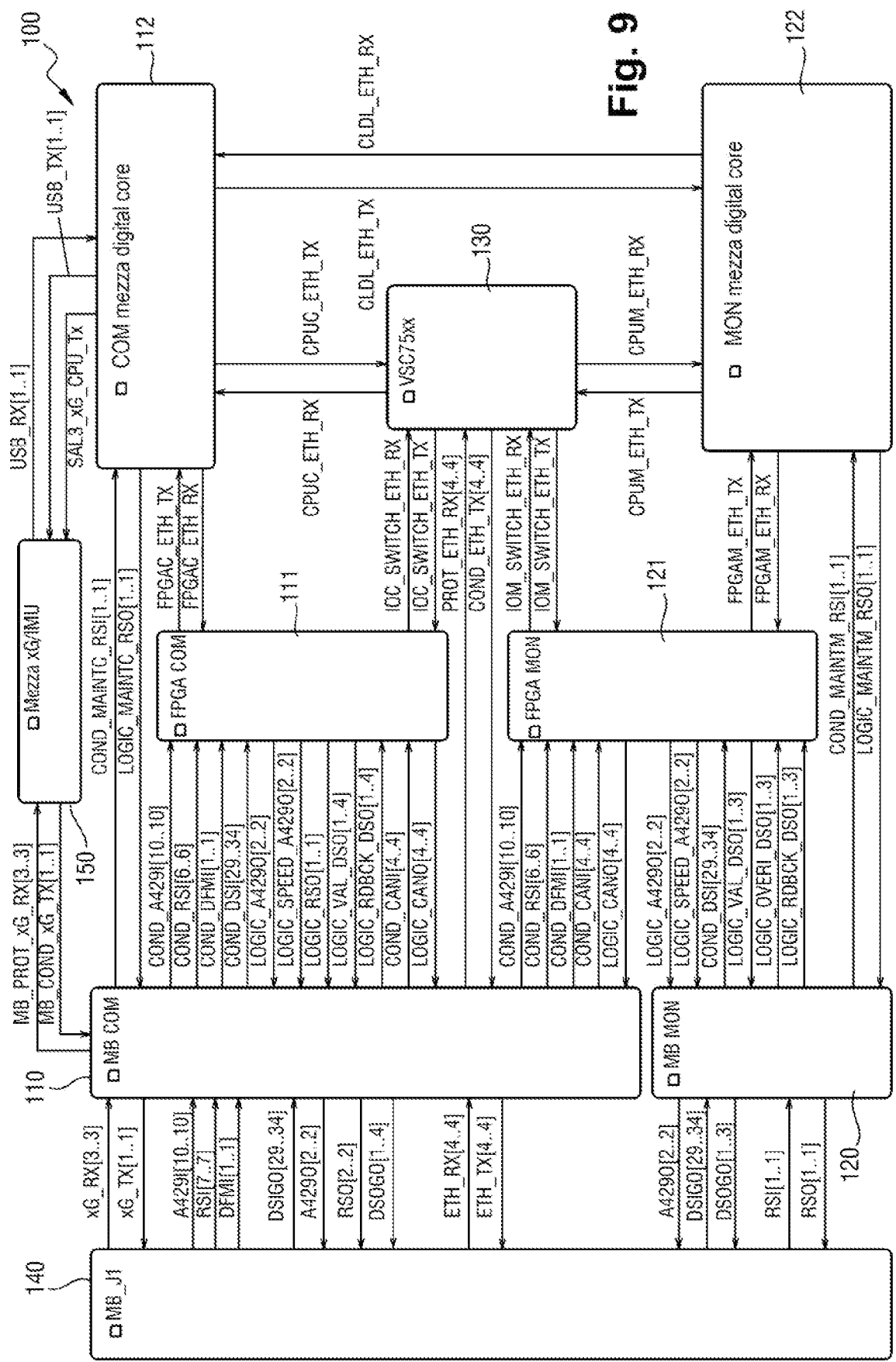
FIG. 9 is a diagrammatic representation of the internal architecture of an avionics platform module.

With reference more particularly to FIG. 9, each avionics platform 100 comprises an electronic circuit having a motherboard subdivided into a control motherboard 110 for forming a control circuit, and a monitoring motherboard 120 for forming a monitoring circuit.

The control motherboard 110 is provided with a control field programmable gate array (FPGA) 111 and with a mezzanine carrying a control core 112. The mezzanine is fastened on one of the faces of the control motherboard 110. The control FPGA 111 is connected to the control motherboard 110 and to the control core 112 in order to exchange data. The control core 112 is also connected to the control motherboard 110.

The monitoring motherboard 120 is provided with a monitoring FPGA 121 and with a mezzanine carrying a core 122. The mezzanine is fastened on a face of the monitoring motherboard 120. The monitoring FPGA 121 is connected to the monitoring motherboard 120, to the control motherboard 110, and to the monitoring core 122 in order to exchange data. The monitoring core 122 is also connected to the monitoring motherboard 120 and to the control core 112.

The control motherboard 110 and the monitoring motherboard 120 are connected to an external connector 130.

The electronic circuit also comprises an Ethernet switch 140 connected to the control motherboard 110, to the control FPGA 111, to the core 112, to the monitoring FPGA 121, and to the core 122 in order to exchange data.

The avionics platform module 100 further comprises an inertial measurement unit 150 connected to the control motherboard 110 and to the control core 112, and carried by the mezzanine mounted on a face of the motherboard 110. This inertial measurement unit 150, e.g. of the microelectromechanical system (MEMS) type, is advantageous since it enables the avionics platform module 100 to monitor the data reaching it from the inertial navigation system 30 and from the attitude and heading reference system 40.

Each avionics platform module 100 includes a common power supply circuit 160 and electronic circuit portions, each including an individual power supply circuit connected to the common power supply circuit 160 and arranged to power the components of that circuit portion at a voltage that is different from the voltage supplied by the common power supply circuit 160.

Figure 10:
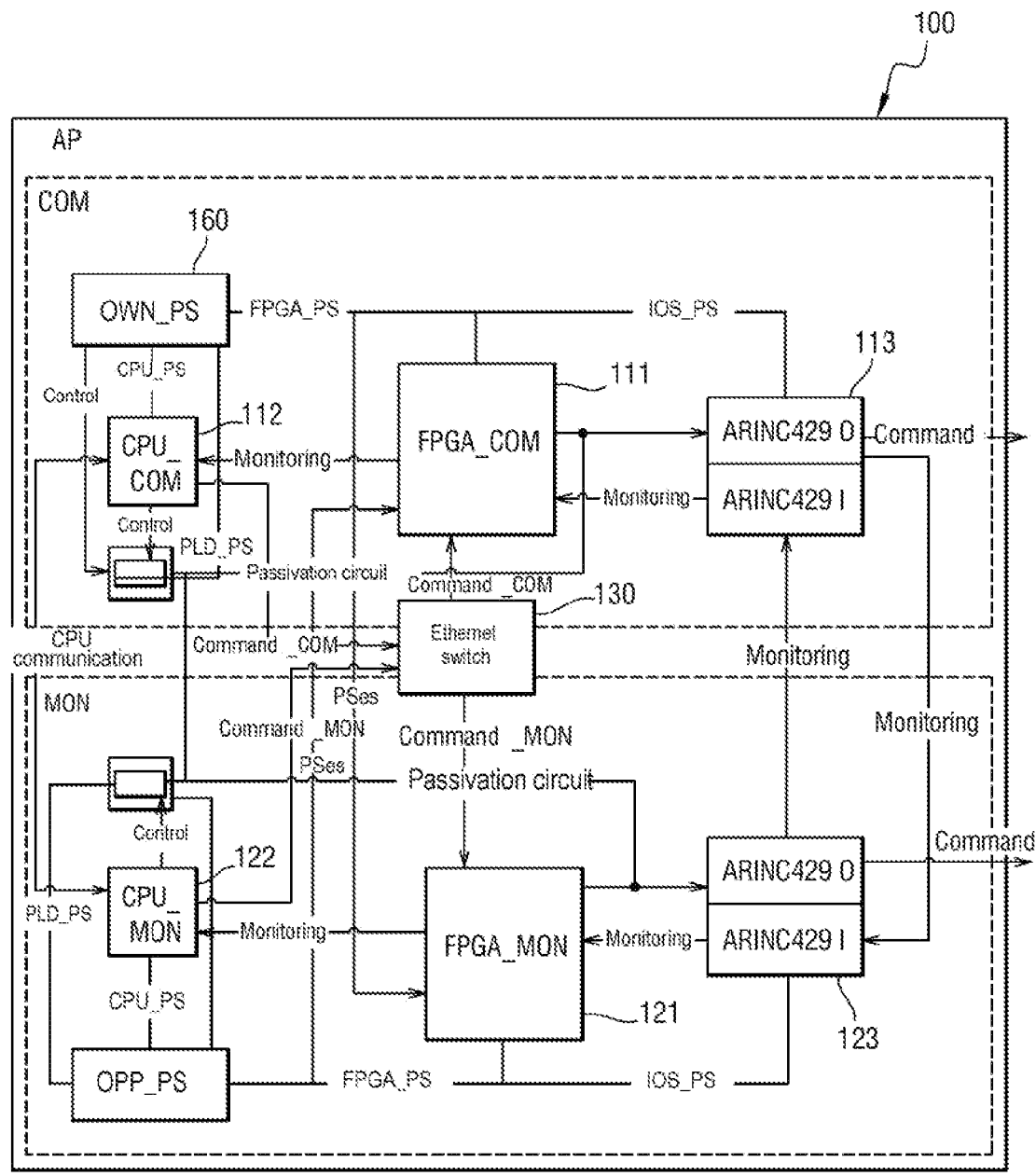
FIG. 10 is a simplified view of FIG. 8.

In FIG. 10, there can be seen the types of signal that are exchanged between the macrocomponents of the electronic circuit of the avionics platform module 100. This figure shows that:
- the control circuit COM and the monitoring circuit MON are each provided with a respective interface 113, 123 in compliance with the ARINC 429 standard, which interfaces are connected to each other and to the external connector;
- the control signals Command_COM issued by the control core 112 transit via the Ethernet switch 130 before reaching the control FPGA 111;
- the control signals Command_MON issued by the control core 122 transit via the Ethernet switch 130 before reaching the monitoring FPGA 121;
- the control signals are transmitted to the outside via the interfaces 113 and 123;
- the monitoring signals Monitoring are exchanged between the control circuit COM and the monitoring circuit MON via the interfaces 113 and 123; and
- the cores 112 and 122 exchange data with each other directly by the channel Communication CPU.

The control circuit and the monitoring circuit are segregated from each other in order to avoid failures propagating from one to the other.

While manufacturing the avionics platform module 100, and when the avionics platform module 100 has a motherboard provided with a plurality of mezzanines, it is ensured that the mezzanines carrying the tallest electronic components are arranged on a common side of the motherboard.

It should be observed that as a result of the protection circuits being within protection modules 400, 500, 600, 700, 800, and 900 that are separate from the avionics platform modules 100 and from the extended connection modules 200, it is easy to test proper operation of the protection circuits.

The method of the invention thus includes the step of individually testing the protection modules 400, 500, 600, 700, 800, and 900 before connecting them to the avionics platform modules 100 or to the extended connection modules 200 or to the video acquisition modules 300.

Naturally, the invention is not limited to the embodiment described, but covers any variant coming within the ambit of the invention as defined by the claims.

In particular, the modules may have internal structures that are different from those described. By way of example, the avionics platform module need not have a mezzanine.

The avionics platform module 100 need not include an inertial measurement unit.

The number of electronic modules may be different. All or some of the electronic modules can be connected to one another.

It is possible to create alternative configurations for loading as a function of failures that have been detected when it is desired to implement reconfiguration mechanisms associated with network failures. In a variant, the modules 100 and 200 are connected together by a Torus type network. In a variant, the method includes the step of adding a component in an avionics platform module 100 in order to adapt it to some predetermined particular specification. The component is advantageously mounted on a mezzanine fitted in the avionics platform module 100, preferably on the motherboard.

Providing a protection circuit that is independent from the circuit that it protects is particularly advantageous in the method of the invention as described above, but it could be implemented independently of that method.

Although it is particularly advantageous to test the protection modules individually before connecting them to the avionics platform modules or to the extended connection modules in the context of the method of the invention, this step is optional.

The invention claimed is:

1. A kit for manufacturing electronic aircraft control units having different specifications, the units comprising electronic modules of different types, including:
    avionics platform modules comprising at least an electronic monitoring circuit and an electronic control circuit that are segregated from each other, the avionics platform modules being identical with one another and being arranged:
    to receive data signals from an inertial navigation system, from attitude and heading reference system, from sensors, from trim device, and from pieces of equipment including engine and landing gear;
    to receive control signals from a pilot interface;
    to respond to the received data signals by preparing the control signals that are to be transmitted to the trim device and to the pieces of equipment;
    to monitor elements to which the elements are connected within the electronic control circuit; and
    to transmit the data signals to the pilot interface;
    first protection modules for protecting the avionics platform modules, the first protection modules being identical with one another;
    first extended connection modules, the first extended connection modules being identical with one another; and
    second protection modules for protecting the extended connection modules, the second protection modules being identical with one another.

2. The kit according to claim 1, wherein each of the avionics platform modules incorporate an inertial measurement unit.

3. The kit according to claim 1, wherein each of the avionics platform modules incorporate a common power supply circuit.

4. The kit according to claim 3, wherein each of the avionics platform modules incorporate circuit portions each including an individual power supply circuit connected to the common power supply circuit and arranged to power at least one component of the circuit portion at a voltage that is different from a voltage supplied by the common power supply circuit.

5. The kit according to claim 1, wherein each of the avionics platform modules comprise a motherboard provided with at least one mezzanine carrying electronic components.

6. The kit according to claim 5, each of the avionics platform module includes a plurality of mezzanines among which the mezzanines include carrying tallest electronic components, the mezzanines carrying the tallest electronic components are arranged on a common side of the motherboard.

7. The kit according to claim 1, wherein the electronic modules include trim modules for performing analog/digital conversion of signals exchanged between the avionics platform modules and an analog trim device.

8. The kit according to claim 1, wherein the electronic modules include actuator control modules for performing analog/digital conversion of signals exchanged between the avionics platform modules and an analog actuator device.

9. The kit according to claim 1, wherein the electronic modules include video acquisition modules and third basic protection modules for protecting the video acquisition modules.

10. The kit according to claim 1, wherein the electronic modules include double first basic protection modules, each arranged to be capable of being connected to two of the avionics platform modules, and single first basic protection modules, each arranged to be capable of being connected to at least one of the avionics platform modules.

11. The kit according to claim 10, wherein the electronic modules include additional protection modules for connecting to the double first or single first basic protection modules in order to adapt them to aircraft of composite structure.

12. The kit according to claim 1, wherein the electronic modules include extended second connection modules, the extended second connection modules being of structure different from the first extended connection modules.

13. The kit according to claim 1, wherein some of the electronic modules incorporate Ethernet interfaces that include an Advanced Ethernet Network type.

14. A kit for manufacturing electronic aircraft control units having different specifications, the units comprising electronic modules of different types, including:
    avionics platform modules comprising at least an electronic monitoring circuit and an electronic control circuit that are segregated from each other, each of the avionics platform modules comprise a motherboard provided with a plurality of mezzanines carrying electronic components among which the mezzanines include carrying tallest electronic components, the mezzanines carrying the tallest electronic components are arranged on a common side of the motherboard, the avionics platform modules being identical with one another;
    first protection modules for protecting the avionics platform modules, the first protection modules being identical with one another;

first extended connection modules, the first extended connection modules being identical with one another; and second protection modules for protecting the extended connection modules, the second protection modules being identical with one another.

15. A kit for manufacturing electronic aircraft control units having different specifications, the units comprising electronic modules of different types, including:

avionics platform modules comprising at least an electronic monitoring circuit and an electronic control circuit that are segregated from each other, the avionics platform modules being identical with one another;

first protection modules for protecting the avionics platform modules, the first protection modules being identical with one another;

first extended connection modules, the first extended connection modules being identical with one another;

second protection modules for protecting the extended connection modules, the second protection modules being identical with one another;

double first basic protection modules, each arranged to be capable of being connected to two avionics platform modules, the double first basic protection modules being identical with one another; and single first basic protection modules, each arranged to be capable of being connected to an avionics platform module, the single first basic protection modules being identical with one another.

* * * * *